United States Patent [19]
Roberts

[11] Patent Number: 5,301,157
[45] Date of Patent: Apr. 5, 1994

[54] COUPLING CIRCUIT AND METHOD FOR DISCHARGING A NON-SELECTED BIT LINE DURING ACCESSING OF A MEMORY STORAGE CELL

[75] Inventor: Gregory N. Roberts, Boise, Id.
[73] Assignee: Micron Technology, Inc., Boise, Id.
[21] Appl. No.: 892,539
[22] Filed: Jun. 1, 1992
[51] Int. Cl.$^5$ .................. G11C 7/00; G11C 11/24
[52] U.S. Cl. ................ 365/203; 365/149; 365/210; 365/202
[58] Field of Search ............... 365/203, 149, 201, 205

[56] References Cited
U.S. PATENT DOCUMENTS
4,792,922 12/1988 Mimoto et al. ................ 365/149
5,184,326 2/1993 Hoffmann et al. ............. 365/149

Primary Examiner—Eugene R. LaRoche
Assistant Examiner—Viet Q. Nguyen
Attorney, Agent, or Firm—Susan B. Collier

[57] ABSTRACT

The invention is a coupling circuit for quickly increasing the differential potential between non-selected bit lines and selected bit lines in the case where the digital data has a high logic state, while retaining a valid differential potential for the case where the digital data has a low logic state. The circuit comprises a true and a complement coupling line typically held at an equilibrate potential substantially equal to the equilibrate potential of the bit lines. A coupling capacitor is electrically interposed between each of the true bit lines and the true coupling line and a coupling capacitor is electrically interposed between each of the complement bit lines and the complement coupling line. During cell selection the potential of the coupling line in electrical communication with the non-selected bit lines is switched to a reference potential by select coupling line circuitry. Once the non-selected bit lines are coupled to the reference potential through the coupling capacitors the equilibrate potential on the non-selected bit lines discharge thereby decreasing the potential on the non-selected bit lines and increasing the differential potential between the selected and the non-selected bit lines.

22 Claims, 6 Drawing Sheets

COUPLING CIRCUIT AND METHOD FOR DISCHARGING A NON-SELECTED BIT LINE DURING ACCESSING OF A MEMORY STORAGE CELL

FIELD OF THE INVENTION

This invention relates to computer memories and more particularly to a dynamic random access memory (DRAM) device having the capability to perform read and write operations from and to a given address.

BACKGROUND OF THE INVENTION

DRAM Architecture

A dynamic random access memory (DRAM) device consists of an arrangement of individual memory storage capacitors capable of storing digital data. The memory storage capacitors are also referred to as memory storage cells, memory cells, storage cells, and cells. The memory is often thought of as having two logic states, a high logic state and a low logic state. Each memory cell comprises a capacitor capable of holding a charge and a field effect transistor, hereinafter referred to as an access transistor, for accessing the capacitor charge. The charge is referred to as the digital data and can be either a high potential or a low potential corresponding to either the high logic state or the low logic state respectively. There are two options available in A DRAM memory, a bit of data may be stored in a selected cell in the write mode, or a bit of data may be retrieved from a selected cell in the read mode.

MEMORY CELLS

An arrangement of memory cells is called an array. The data is transmitted on signal lines, also called bit lines, to and from input/output lines, hereinafter known as I/O lines, through field effect transistors. For each bit of data stored, its true logic state is available at one I/O line and its complementary logic state is available at a second I/O line designated I/O*.

Each cell has two bit lines, referred to as a bit line pair. A bit line pair transmits the true and complementary data from the accessed cell to the I/O lines and I/O* respectively. Therefore the bit line transmitting the true data is referred to as the true bit line and the bit line transmitting the complementary data is referred to as the complement bit line.

A memory cell is connected through the access transistor to one bit line when accessed. For this discussion this bit line containing the accessed memory cell will be referred to as the selected bit line. The remaining bit line of the bit line pair is called the non-selected bit line. None of the memory cells are connected through the access transistor to the non-selected bit line.

Read And Write Operations

In order to read from or write to a cell, the particular cell in question must be selected, also called addressed. The cells are arranged in the array in a configuration of intersecting rows and columns. The rows are also referred to as wordlines. In order to select one cell to read from or write to, first a row decoder activates and then a column decoder activates. An active output from the row decoder selects a wordline appropriate the given address. The active wordline then turns on the cells' access transistors thereby accessing the cell and allowing the cells' data charge to be shared with the charge of the selected bit line of each bit line pair. Only one cell for each bit line pair is accessed. After a time delay, during which the cell data reaches a bit line sense amplifier, the sense amplifier amplifies and latches the data on the bit line pair. Next the column decoder activates and selects the desired bit line pair. The true and complement bit lines are then connected to the I/O lines through two decode transistors which are commonly enabled by the activated column decoder output.

Bit Line Equilibration

A supply potential, $V_{cc}$, and a ground reference potential, $V_{ss}$, are available to the circuitry of the memory device. Between cycles of cell selection it is necessary to equilibrate the bit lines of each bit line pair in a memory array to the same potential, usually $V_{cc}/2$. This equilibration of the bit lines occurs during a time frame often referred to as the precharge cycle. Equilibrate circuitry parallel with the sense amplifier essentially shorts the bit lines together and typically holds them at $V_{cc}/2$. This equilibration is necessary so that the bit lines are ready to receive data during the active cycle of cell selection. However, the equilibrate circuitry is disabled prior to the initiation of the active cycle thereby allowing the digital data to be coupled to the bit lines.

DIFFERENTIAL POTENTIAL SENSING

The sense amplifier essentially senses a differential potential and then amplifies that differential potential and latches the high and low logic states to the respective bit lines. In this case the differential potential is the difference in potential between the selected and the non-selected bit lines for each bit line pair. There is typically a minimum potential difference required by a sense amplifier before it can actually sense a difference in potential. The non-selected bit line is at the equilibrate potential and the selected bit line is coupled to a memory cell having either a low potential or a high potential. Thus, in this case, the sense amplifier senses the difference in potential between the equilibrate potential and the potential of the selected cell. Once the sense amplifier has amplified the differential potential the true data and the complementary data are latched to the bit line pair.

THE ACTIVE CYCLE

At this juncture, the discussion will focus on what is specifically happening in the circuit once the row decoder has activated and prior to the transfer of the data to the I/O lines. If the stored data has a low potential the potential of the selected bit line starts to decrease from the equilibrate potential once the cell has been accessed. The non-selected bit line remains at the equilibrate potential. As the potential of the selected bit line decreases the differential potential increases to an extent that the sense amplifier senses the difference and amplifies the difference to the bit line pair such that the selected bit line attains said low logic state and the non-selected bit line attains said high logic state.

In the case where the accessed cell is storing a high logic state, there is an increased time delay before the potential of the selected bit line starts to increase toward the high potential. Thus there is a significant time delay before the differential potential is large enough for the sense amplifier to sense the difference in potential. As the potential of the selected bit line increases the differential potential eventually increases to an extent that the sense amplifier senses the difference and amplifies the difference to the bit line pair such that the selected bit line attains the high logic state and the non-selected bit line attains the low logic state.

SUMMARY OF THE INVENTION

Problem

There is a need to sense the differential potential sooner in the case where a high logic state is stored in the cell in order to increase the speed of the DRAM device. The invention of the present embodiment provides for a more rapid increase in the differential potential in the case where the accessed cell is storing a high logic state. The invention accomplishes this feat by decreasing the equilibrate potential of the non-selected bit line even before the selected bit line starts to increase toward the high potential.

Solution

As will be detailed, the invention of the preferred embodiment utilizes a cell plate capacitor having a linear voltage-capacitance response. In this application the cell plate capacitor is typically a capacitor manufactured on a semiconductor wafer wherein the storage node plate of the capacitor is an active area of the substrate and the cell plate of the capacitor is a polysilicon layer overlying the active area. A dielectric layer is interposed between the storage node plate and the cell plate. "Silicon Processing for the VLSI Era", Volume 1, Process Technology, by Stanley Wolf and Richard N. Tauber, Lattice Press 1986, and Volume 2, Process Integration, by Stanley Wolf, Lattice Press 1990 is incorporated by reference as one source describing a process for forming a cell plate capacitor. There exists various modifications of cell plate capacitors as well as various processes for making cell plate capacitors. The exact process utilized in manufacturing the capacitor as well as the exact capacitor implemented is not necessarily limited by the embodiment described herein.

The invention is a coupling circuit for quickly increasing the differential potential between the non-selected bit lines and the selected bit lines in the case where the digital data has a high logic state while retaining a valid differential potential for the case where the digital data has a low logic state.

The circuit comprises a true and a complement coupling line typically held at an equilibrate potential substantially equal to the equilibrate potential of the bit lines. A coupling capacitor is electrically interposed between each of the true bit lines and the true coupling line and a coupling capacitor is electrically interposed between each of the complement bit lines and the complement coupling line. During cell selection the potential of the coupling line in electrical communication with the non-selected bit lines is driven to $V_{ss}$ or a ground potential by select coupling line circuitry.

Once the non-selected bit lines are coupled toward the ground potential through the coupling capacitors the equilibrate potential on the non-selected bit lines decreases thereby increasing the differential potential between the selected and the non-selected bit lines. Therefore, the sense amplifier more rapidly senses a valid differential potential in the case where the digital data has a high logic state.

ADVANTAGES

By decreasing the potential on the non-selected bit lines the bit line voltage separation increases in a shorter period of time than it would have if the non-selected bit lines remained at the equilibrate potential for the case where the digital data has a high logic state. Therefore, the sense amplifier senses this differential potential sooner than it would have otherwise, thereby increasing the speed of the DRAM device. Thus, access time is increased, since the sense amplifier is turned on sooner.

The cell signal is defined as the potential stored on the memory storage capacitor of a memory device. The cell margin is defined as the difference in potential between the cell signal and the potential of the bit lines of the memory device. Therefore the cell margin can be increased by retaining a given cell signal and decreasing the equilibrate potential of the bit lines. A larger cell margin increases the reliability of a memory device and reduces the soft error rate (SER). The SER is the number of errors experienced by a memory device during a fixed unit of time due to factors other than the memory device itself. The most common factor causing soft error is radiation. A major problem in DRAMs is that a stored high potential will leak away or not be written high enough initially, thereby decreasing the one's margin. Thus there exists a need to increase the cell margin. By decreasing the equilibrate potential during cell sensing, the invention of the present embodiment increases the cell margin while in turn increasing the reliability of the device.

Features of the present invention will become clear from the following detailed description of the invention taken in conjunction with the accompanying drawings.

DETAILED DESCRIPTION OF THE PREFERRED EMBODIMENT

Definitions

A selected bit line is a bit line coupled to a memory cell that is accessed when an active wordline activates an access transistor. Typically one bit line of each bit line pair becomes a selected bit line for an active wordline.

The non-selected bit line is the bit line of the bit line pair which is not the selected bit line.

A selected coupling line is the coupling line in electrical communication with the non-selected bit line.

The non-selected coupling line is the coupling line in electrical communication with the selected bit line.

In this detailed description the differential potential is the potential difference between the selected and non-selected bit lines.

A cell plate capacitor is a capacitor having a linear voltage-capacitance response. In this application the cell plate capacitor is typically a capacitor manufactured on a semiconductor wafer, wherein the storage node plate of the capacitor is an active area of the substrate, and the cell plate of the capacitor is a polysilicon layer overlying the active area. A dielectric layer is interposed between the storage node plate and the cell plate.

The cell plate capacitor typically has a linear voltage-capacitance response. Therefore the voltage is coupled more linearly and ideally across the cell plate capacitor than it would be if it were coupled across a MOS gate capacitor. A MOS gate capacitor has a much different capacitor-voltage curve or interaction curve than the corresponding curve of the cell plate poly capacitor. The cell plate capacitor also has a much higher capacitance per unit area than does the MOS gate capacitor, therefore its implementation requires much less die space.

There exists various modifications of cell plate capacitors as well as various processes for making cell plate capacitors. The exact process utilized in manufacturing the capacitor as well as the exact capacitor implemented is not necessarily limited by the embodiment described herein.

The Coupling Circuit of the Preferred Embodiment

The invention is a coupling circuit for increasing the speed of a DRAM device by providing for a rapid detection of a differential potential between the selected bit line and the potential of the non-selected bit line. The circuit provides a means for decreasing the potential of the non-selected bit line thereby more rapidly increasing the differential potential.

FIG. 1

Figure 1:
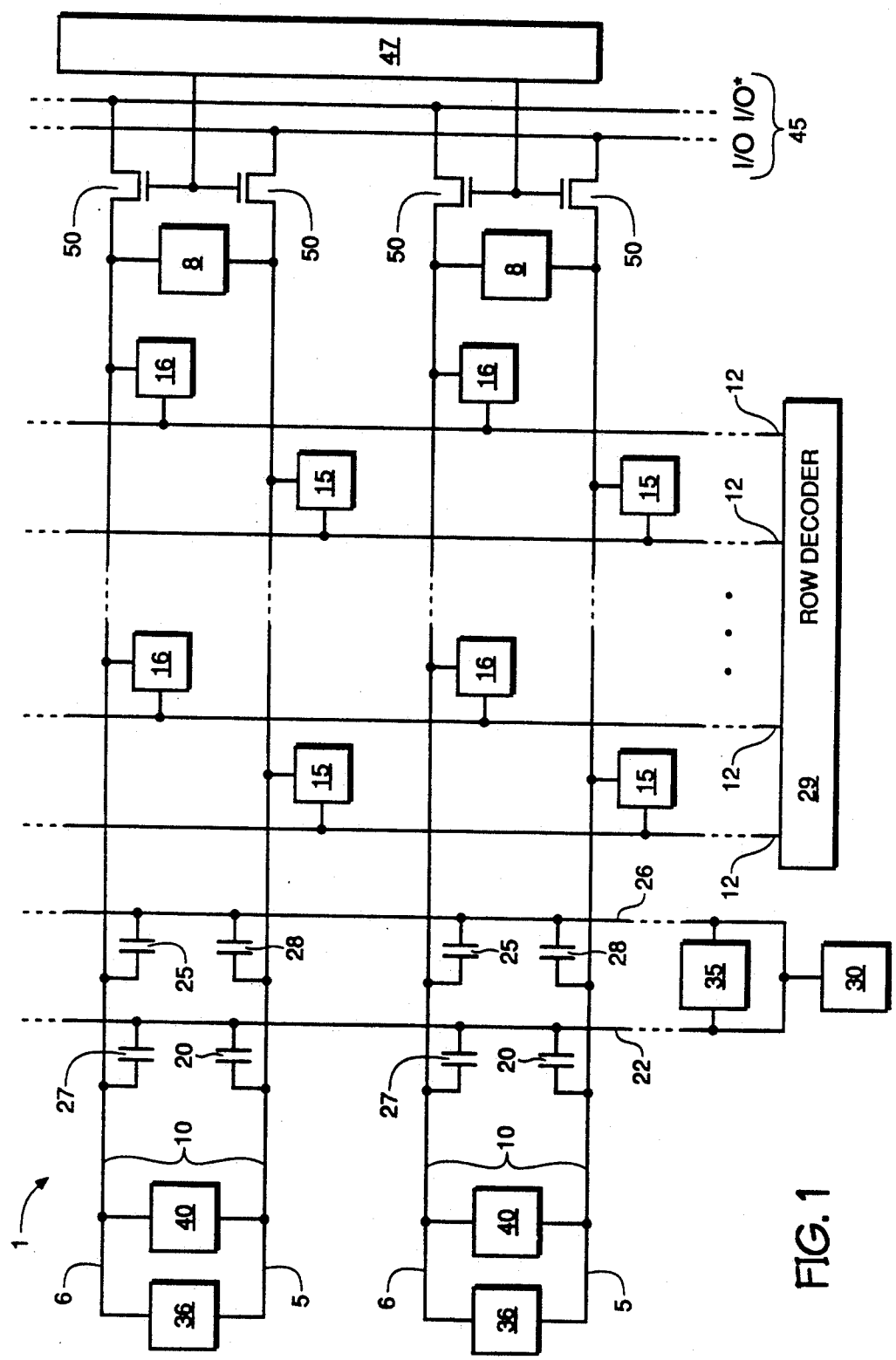
FIG. 1 is a schematic of the preferred embodiment.

FIG. 1 is a schematic of a portion of the coupling circuit 1 of the invention. A true bit line 5 and a complement bit line 6 comprise a bit line pair 10. A wordline 12 is capable of selecting either a memory cell 15 on each of the true bit lines 5 or a memory cell 16 on each of the complement bit lines 6.

Coupling Capacitors

A true coupling capacitor 20 is electrically interposed between each true bit line 5 and a true coupling line 22, and a complement coupling capacitor 25 is interposed between each complement bit line 6 and a complement coupling line 26. The true 20 and complement 25 coupling capacitors are typically cell plate capacitors having a linear voltage-capacitance response.

A stray capacitance inadvertently develops between each complement bit line and the true coupling line, and a stray capacitance inadvertently develops between each true bit line and the complement coupling line. These stray capacitances are represented by stray capacitors 27 and 28 respectively. The cause and effects of the stray capacitance shall be further described in following portions of the detailed description.

Bit Line and Coupling Line Selection

One of the wordlines 12 is activated by the row decoder 29. This activation, in effect, determines the selected bit lines. Therefore the row decoder 29, wordlines 12 and peripheral circuitry (not shown) for activating the row decoder can be thought of as select bit line circuitry. By monitoring the selection of the selected bit lines, select coupling line circuitry 30 can determine the non-selected bit lines and therefore the selected coupling line, which is coupled to the non-selected bit line by the coupling capacitor interposed between the non-selected bit line and the selected coupling line.

The actual circuit implementation of the select coupling line circuitry used to determine the selected coupling line can vary. It is possible that the select coupling line circuitry monitor the row decoder output thereby sensing the selected bit line and providing the switching signal to the selected coupling line in electrical communication with the non-selected bit line in order to pull the non-selected bit line toward the ground potential. This type of circuit implementation is well known to those skilled in the art.

The Precharge Cycle

During the precharge cycle the select coupling line circuitry 30 switches the coupling lines 22 and 26 to equilibrate circuitry 35 that holds the coupling lines 22 and 26 at an equilibrate potential substantially equal to the equilibrate potential of the bit lines 5 and 6. Equilibrate circuitry 36 equilibrates bit lines 5 and 6 during precharge.

The Active Cycle

During an active cycle the equilibrate circuitry 36 is disabled allowing the bit lines to attain potentials other than the equilibrate potential. Also during the active cycle the select coupling line circuitry 30 drives the selected coupling line to the ground potential thereby coupling the non-selected bit line to the ground potential through the coupling capacitor. The select coupling line circuitry 30 allows the non-selected coupling line to remain equilibrated to the equilibrate potential.

As the potential of the non-selected bit lines decreases from the equilibrate potential, the differential potential between selected bit lines having a high logic state and the non-selected bit lines rapidly increases. The equilibrate potential on the non-selected bit line decreases to a potential that is approximately mid-value between the selected bit line high logic state and low logic state at the time the differential potential is sensed. Thus, the differential potential also remains valid for the case wherein the digital data has a low logic state. Once the differential potential has been sensed by the sense amplifiers 40 it is amplified and the true and complementary logic states are latched to the bit line pairs 10. The data on one bit line pair is then selected for transfer to the I/O lines 45 by the column decoder 47 which activates the appropriate decode transistors 50.

Figure 2:
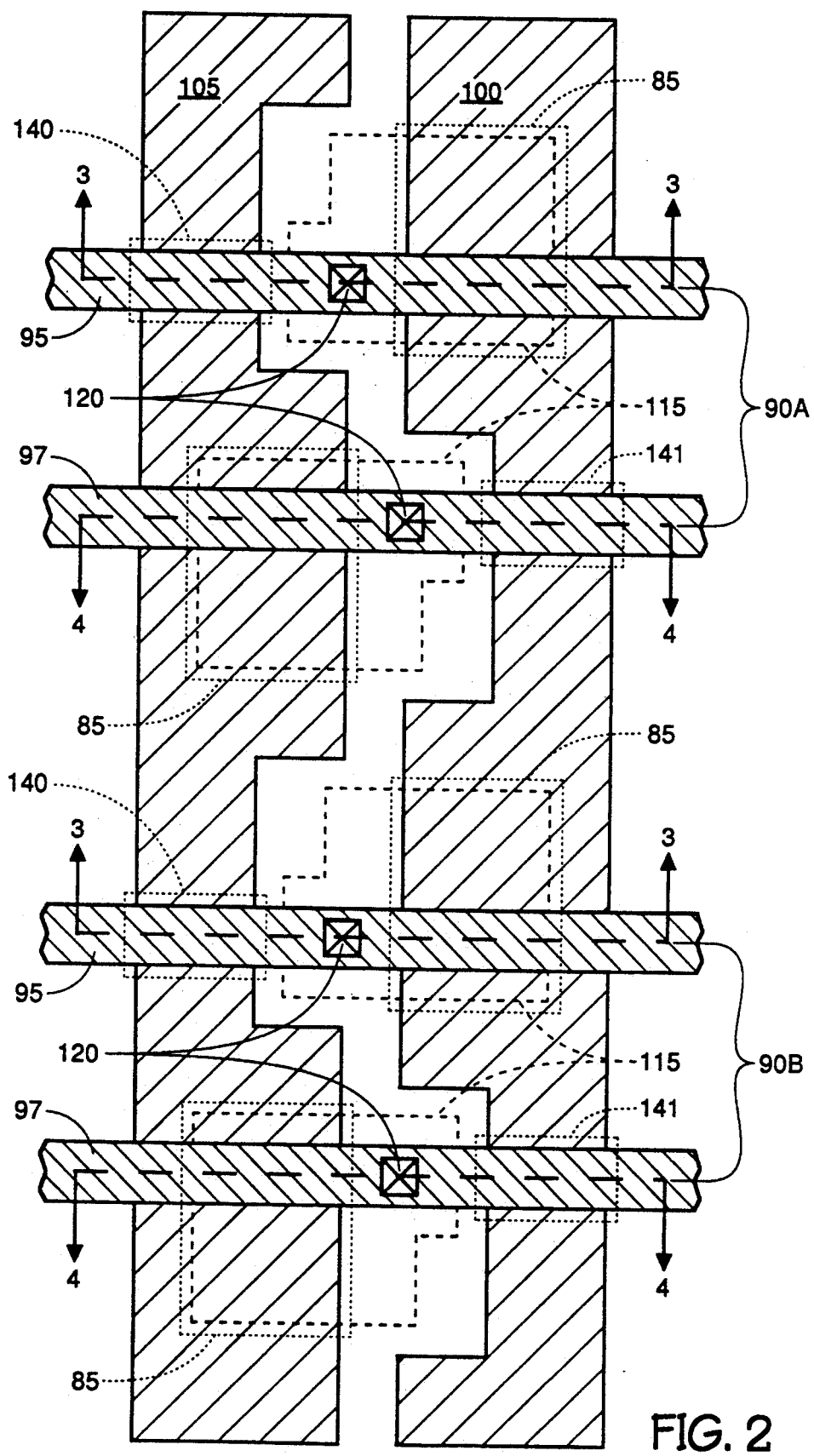
FIG. 2 is a top planar view of a manufactured embodiment of the invention.
Figure 3:
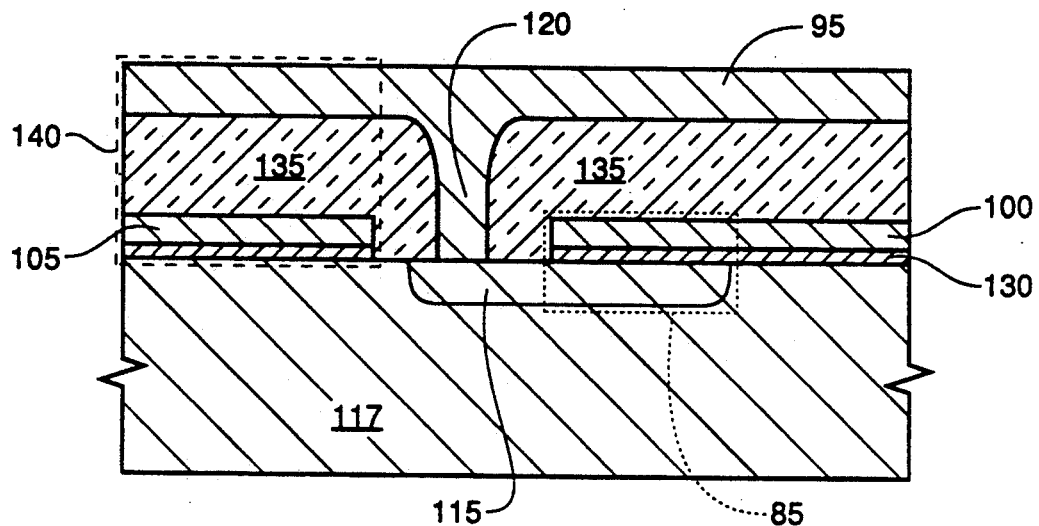
FIG. 3 is a cross-sectional view of FIG. 2 at section lines 3—3.
Figure 4:
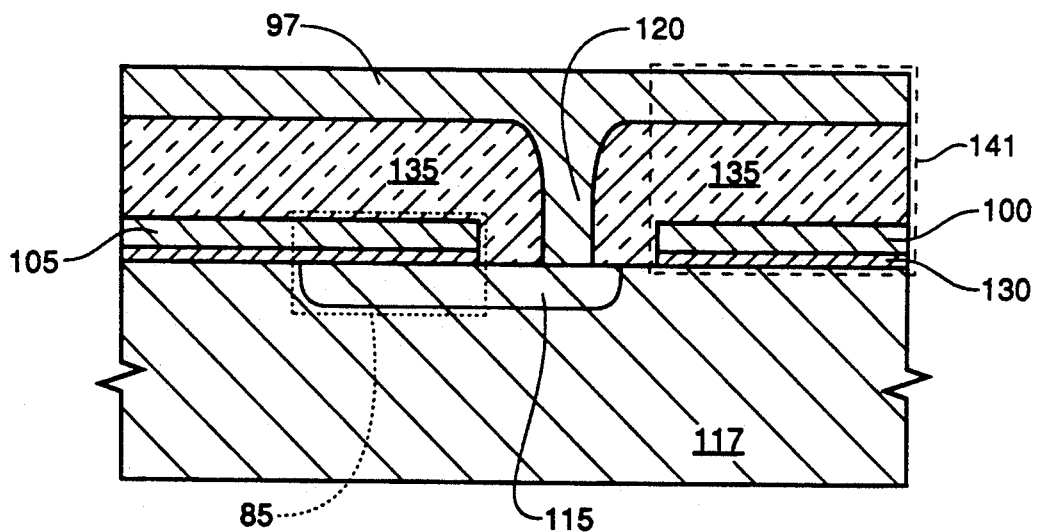
FIG. 4 is a cross-sectional view of FIG. 2 at section lines 4—4.

FIGS. 2, 3 and 4

FIG. 2 is a simplified top planar view of the manufactured coupling capacitors 85 of the preferred embodiment for two bit line pairs 90A and 90B, each pair having a true bit line 95 and a complement bit line 97. FIG. 2 represents an intermediate stage of the process before the complete circuit layerization has been performed. FIG. 3 is a cross sectional view of FIG. 2 along the true bit lines 95 at section lines 3—3, and FIG. 4 is a cross section view of FIG. 2 along the complement bit lines 97 at section lines 4—4.

FIGS. 2, 3, and 4 show the true coupling line 100 and the complement coupling line 105. Overlying the coupling lines 100 and 105 are the bit line pairs 90A and 90B. The bit lines 95 and 97 make contact with the active areas 115 of the substrate 117 through the contact plugs 120.

It can be seen that a contact plug 120 is in electrical communication with each active area 115. The active area 115 functions as the storage node plate of each coupling capacitor 85. The coupling lines 100 and 105 overlying the active areas 115 function as the cell plates of the coupling capacitors 8 and are insulated from the active areas 115 by a dielectric layer 130. The dielectric layer 130 is typically silicon nitride. It can be seen that the true coupling line 100 is in electrical communication with the coupling capacitors 85 formed with the active areas 115 in electrical contact with the true bit lines 95, and that the complement coupling line 105 is in electrical communication with the coupling capacitors 85 formed with the active areas 115 in electrical contact with the complement bit lines 97.

A thick layer of dielectric 135, typically an oxide, insulates the polysilicon coupling lines 100 and 105 from the bit lines 95 and 97. Although there is a stray capacitance induced because the oxide layer functions as a dielectric between the true bit line and the true coupling line and functions as a dielectric between the complement bit line and the complement coupling line, it is typically negligible when the bit line is discharging through the coupling capacitor.

The stray capacitors 27 and 28, shown schematically in FIG. 1, do however affect the potential of the selected bit lines. A portion of each coupling line underlies each of the bit lines 95 and 97 and is insulated from the bit lines by the dielectric layer 135. Thus, the stray capacitors 140 and 141, shown in FIG. 2, and FIGS. 3 and 4 respectively, are formed. Stray capacitor 140 of FIG. 3 corresponds to stray capacitor 27 of FIG. 1, and stray capacitor 141 of FIG. 4 corresponds to stray capacitor 28 of FIG. 1. This stray capacitance has a tendency to decrease the potential of the selected bit lines. Therefore the circuit must be designed to minimize this stray capacitance affect.

Parameters

The low potential of the selected coupling line also tends to reduce the potential of the selected bit lines through the stray capacitors, therefore the circuit is designed such that the capacitance of the coupling capacitor is greater than the capacitance of the stray capacitor by an amount that allows the potential of the non-selected bit line to decrease from the equilibrate potential prior to high logic state being coupled to the selected bit line. A coupling capacitor 85 having a capacitance equal to 0.024 pf in conjunction with a stray capacitance of 0.003 pf is one preferred embodiment.

The capacitance of the coupling capacitor is designed such that the equilibrate potential on the non-selected bit line decreases to a potential that is approximately mid-value between the selected bit line high logic state and low logic state at the time the differential potential is sensed. Thus, the differential potential remains valid for the case wherein the digital data has either a low logic state or a high logic state.

In order to avoid breakdown of the dielectric and damage to the coupling capacitor, the time during which the selected coupling line is held at the ground potential is minimized. The select coupling line circuitry 30 typically holds the selected coupling line to the reference potential for less than 5 nsec, thereby controlling the amount of discharge of the coupling capacitor.

An Example

A specific example referenced to FIGS. 2, 3, and 4 will better explain the preferred embodiment of the invention. If the true bit lines 95 are the selected bit lines, then complement coupling line 105 becomes the selected coupling line, and the select coupling line circuitry switches the potential of the complement coupling line 105 to the reference potential. Therefore, the potential on the non-selected bit lines decrease, in this case on bit lines 97, as the coupling line switches towards the reference potential. This decrease in non-selected bit line potential is proportional to the ratio of the capacitance of the coupling capacitor to the total capacitance of the bit line.

FIG. 5

Figure 5:
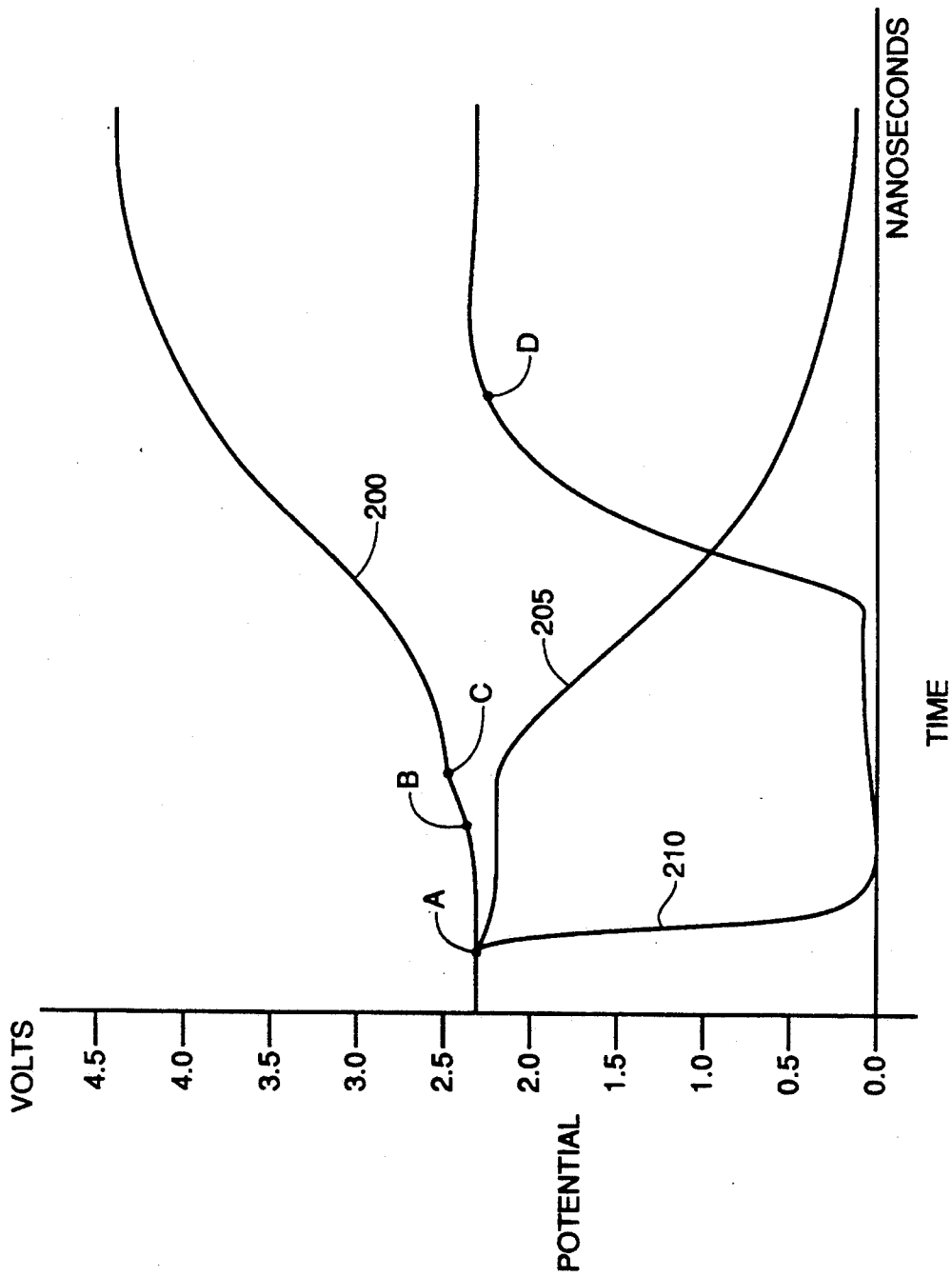
FIG. 5 is a graphical depiction comparing the voltage on the selected bit line and the voltage on the non-selected bit line in reference to the potential of the selected coupling line.

FIG. 5 is a simplified graphical depiction of an actual simulation comparing the voltage on the selected bit line 200 and the voltage on the non-selected bit line 205 in reference to the potential of the selected coupling line 210 in the case where the digital data being accessed has a high logic state. Initially it can be seen that the select coupling line circuitry holds the potential of the coupling line to the equilibrate potential and that the bit lines are held at the equilibrate potential. Once a cell has been selected the select coupling line circuitry determines the selected coupling line and switches the potential of the selected coupling line to the reference potential thereby decreasing the equilibrate potential of the non-selected bit line at approximately point A. The non-selected coupling line remains at the equilibrate potential. Thus when the high logic state is coupled from the memory cell to the selected bit line at approximately point B a differential potential already exists between the selected bit line and the non-selected bit line. In this case the potential of the non-selected bit line decreases 100 mv from that of the equilibrate potential, based upon an 8 to 1 ratio of coupling capacitance to stray capacitance. Therefore before the potential of the selected bit line begins to increase at point B, the differential potential is already 100 mv. Shortly thereafter, at approximately point C, the sense amplifier amplifies the differential potential. The potential of the selected bit line is latched to a high logic state, and the potential of the non-selected bit line is latched to a low logic state. Previously and without the applicant's invention this differential potential of 100 mv would not have been achieved until the potential of the selected bit line increased 100 mv. Therefore, the applicants coupling circuit will speed the sensing of the differential potential by the sense amplifier by at least 2-3 nanoseconds. The select coupling line circuitry allows the selected coupling line to be coupled to the reference potential for less than 5 nanoseconds. It can be seen in FIG. 5 that the select coupling line circuitry drives the coupling line to the equilibrate potential at approximately point D thereby assuring that the voltage sensitive dielectric of the cell plate capacitor does not suffer any permanent damage.

FIG. 6

Figure 6:
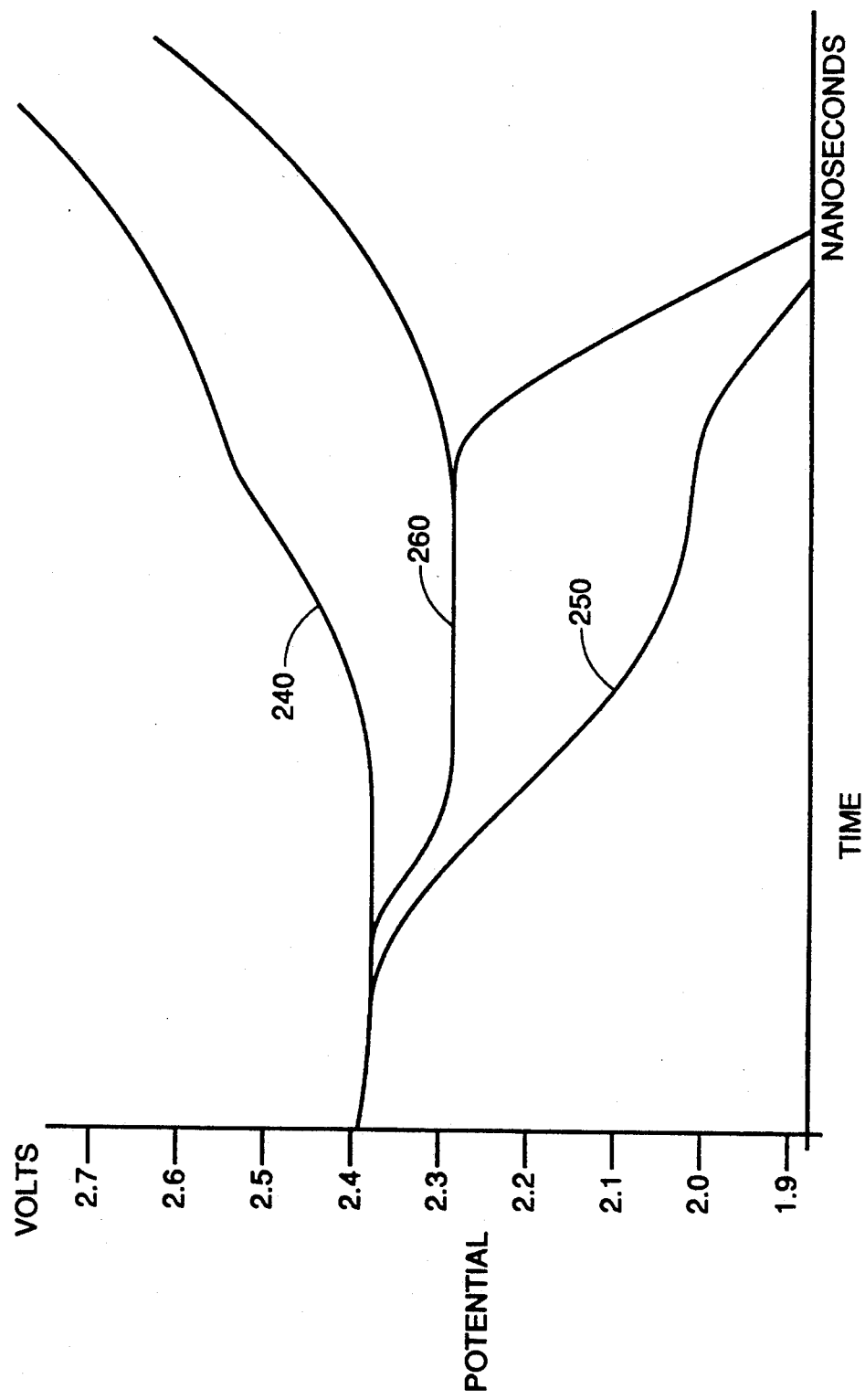
FIG. 6 is a graphical depiction of the voltage of the non-selected bit line in reference to the two possible voltages of the selected bit line.

FIG. 6 is a graphical depiction of the voltage of the non-selected bit line in reference to the two possible voltages of the selected bit line. Typically the bit line having a selected cell storing a low logic state will start pulling toward the reference potential, $V_{ss}$, sooner than a bit line having a selected cell storing a high logic state will start pulling toward to the supply potential, $V_{cc}$. This is due to the fact that as the access transistor's gate potential ramps from $V_{ss}$ to $V_{cc}$, and the memory cell storing a low logic state will turn-on sooner than a memory cell storing a high logic state. FIG. 6 shows both scenarios. Line 240 represents the potential of the selected bit line when a high logic state is stored in the memory cell. Line 250 represents the potential of the selected bit line when a low logic state is stored in the memory cell. By coupling the non-selected bit line through the coupling capacitor of the invention the potential, as depicted by line 260, of the non-selected bit line is centered between the two possible potentials of the selected bit line. The invention makes the challenge to sense and amplify very small differential potentials much easier and faster for the case where a high logic state is stored in the selected cell while retaining the speed and ease of amplifying very small differential potentials for the case where a low logic state is stored in the selected cell.

FIG. 7

Figure 7:
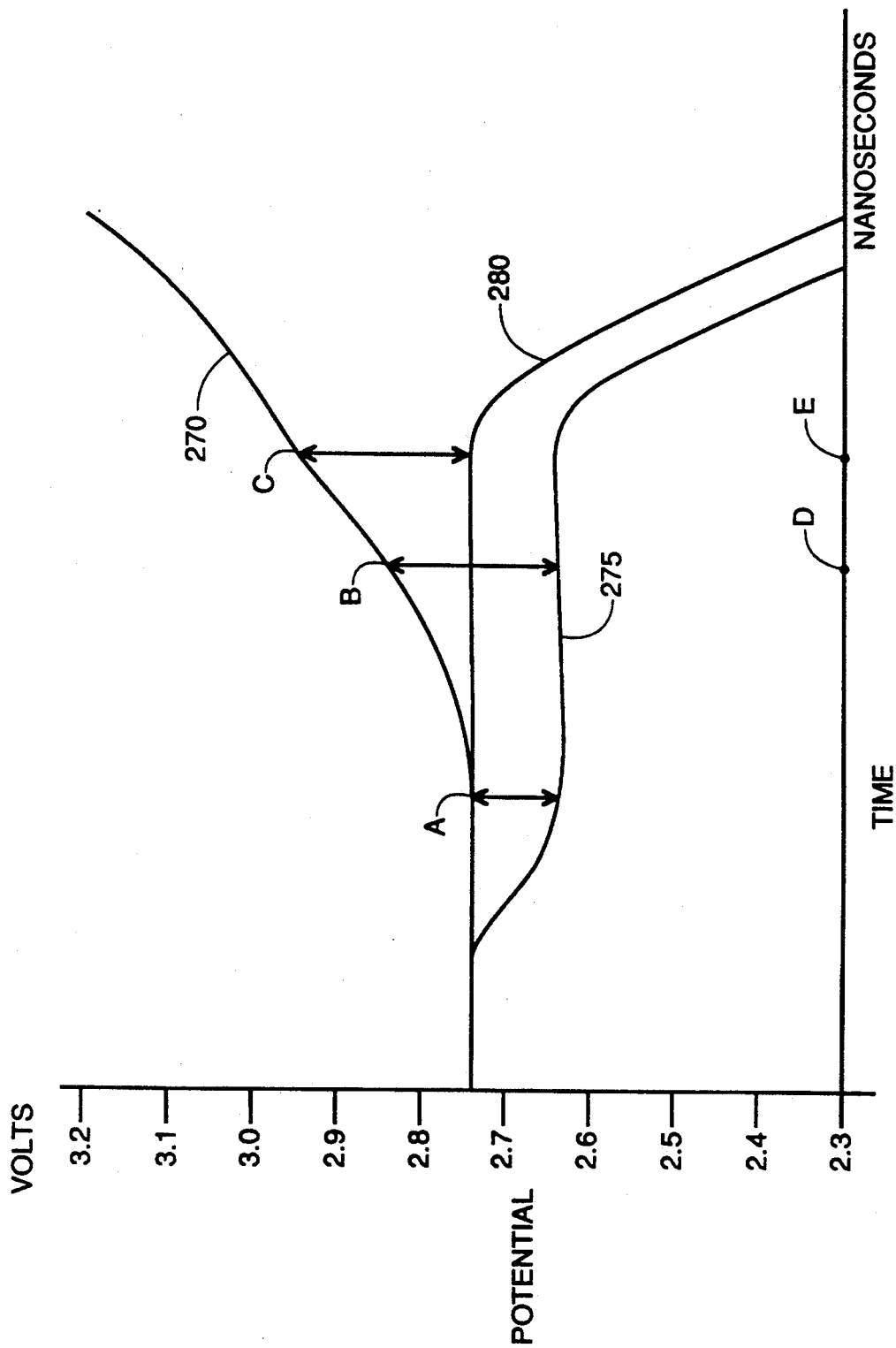
FIG. 7 is a graphical depiction of a specific example detailing the voltages of the selected and non-selected bit lines for the preferred embodiment in comparison to the voltages of the selected and non-selected bit lines for a circuit of the related art.

FIG. 7 is a graphical depiction of a specific example detailing the voltages of the selected and non-selected bit lines for the preferred embodiment in comparison to the voltages of the selected and non-selected bit lines for circuits of the related art which do not have the circuit of the preferred embodiment. Assume the sense amplifier requires a 200 mv separation of the potentials in order to sense a differential potential. Again assume that the selected cell has a high logic state. These assumptions will be applicable to both the preferred embodiment and the related art. Line 270 represents the voltage of the selected bit line for both the preferred and the related art. Line 275 represents the voltage of the non-selected bit line of the preferred embodiment. It can be seen that the potential of the non-selected bit line is initially reduced by approximately 100 mv from the equilibrate potential at approximately point A. Therefore using the coupling circuitry of the invention to lower the equilibrate potential by 100 mv, the 200 mv separation occurs at point B. In the DRAM devices of the related art where the potential of the non-selected bit line remains at the equilibrate potential, as depicted by line 280, the 200 mv separation would not have occurred until point C. Using the TIME axis as a time reference the differential potential is sensed at point D for the circuit of the preferred embodiment and at point E for the circuit of the related art. Since the coupling circuitry of the preferred embodiment allows the sensing to begin much sooner than would happen in the circuitry of the related art, the speed of the DRAM device is increased significantly over the speed of the DRAM of the related art.

Advantages

By decreasing the potential on the non-selected bit line the bit line voltage separation increases in a shorter period of time than if the non-selected bit line remained at the equilibrate potential, for the case where the digital data has a high logic state. Thus the sense amplifier senses this differential potential sooner than it would have otherwise thereby increasing the speed of the DRAM device. The access time is therefore increased since the sense amplifier is turned on sooner.

The invention makes the challenge to sense and amplify very small differential potentials much easier and faster for the case where a high logic state is stored in the selected cell while retaining the speed and ease of amplifying very small differential potentials for the case where a low logic state is stored in the selected cell.

The invention also improves the ones margin since lowering the equilibrate potential of the non-selected bit line increases the difference in potential between the potential of the cell and the potential of the non-selected bit line. Increasing the one's margin increases the reliability of the device by providing proper sensing of the memory cell and proper write back to the memory cell.

The cell plate poly capacitor has a linear voltage-capacitance response which means that the voltage is coupled more linearly and ideally across it than it would be coupled across a MOS gate capacitor. A MOS gate capacitor has a much different capacitor-voltage curve or interaction curve than the corresponding curve of the cell plate poly capacitor. The cell plate capacitor also has a much higher capacitance per unit area than does the MOS gate capacitor, therefore its implementation requires much less die space.

Thus it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

I claim:
1. A circuit for storing digital data, comprising:
   a) a memory storage cell for storing the digital data;
   b) a selected bit line in electrical communication with said memory storage cell;
   c) a non-selected bit line, electrically isolated from said memory storage cell, having a first bit line potential;
   d) a selected coupling line capable of electrical communication with said non-selected bit line;
   e) a non-selected coupling line capable of electrical communication with said selected bit line;
   f) a coupling circuit electrically interposed between and capable of providing said electrical communication between said non-selected bit line and said selected coupling line and electrically interposed between and capable of providing said electrical communication between said selected bit line and said non-selected coupling line; and
   g) a coupling line selection circuit for driving a potential of said selected coupling line to a reference coupling potential,
      said reference coupling potential being substantially different than said first bit line potential, wherein said non-selected bit line is electrically coupled to said selected coupling line through said coupling circuit thereby effecting a second bit line potential on said non-selected bit line,
      said second bit line potential lying within a range of potentials between said first bit line potential and said reference coupling potential and including said reference coupling potential.

2. The circuit as specified in claim 1, wherein said coupling line selection circuit drives a potential of said non-selected coupling line to a non-selected coupling potential, said non-selected coupling line potential being substantially equal to said first bit line potential.

3. A circuit for storing digital data, comprising:

a) memory storage cells for storing the digital data;
b) bit line pairs each of said bit line pairs having a true bit line and a complement bit line, each of said true and complement bit lines capable being in electrical communication with at least one of said memory storage cells;
c) a selected bit line, said selected bit line being one of said true bit line and said complement bit line, said selected bit line being in electrical communication with an accessed one of said memory storage cells;
d) a non-selected bit line, said non-selected bit line being a remaining one of said true bit line and said complement bit line, such that said at least one of said memory storage cells capable of electrical communication with said non-selected bit line is isolated from said non-selected bit line, said selected and said non-selected bit lines having an initial bit line potential;
e) a true coupling line;
f) a complement coupling line;
g) a first coupling means, electrically interposed between each of said true bit lines and said true coupling line, for electrically coupling each of said true bit lines to said true coupling line;
h) a second coupling means electrically interposed between each of said complement bit lines and said complement coupling line, for electrically coupling each of said complement bit lines to said complement coupling line;
i) a coupling line selection means for selecting a selected coupling line and a non-selected coupling line,
said true coupling line being said selected coupling line and said complement coupling line being said non-selected coupling line when said complement bit line is said selected bit line,
and said complement coupling line being said selected coupling line and said true coupling line being said non-selected coupling line when said true bit line is said selected bit line; and
j) a driving means for driving a potential of said selected coupling line to a coupling potential, wherein said coupling potential is substantially different than said initial bit line potential, and wherein said non-selected bit line is coupled through one of said first and said second coupling means to said selected coupling line such that said initial bit line potential on said non-selected bit line changes from said initial bit line potential to a potential lying within a range of potentials between said initial bit line potential and said coupling potential and including said coupling potential.

4. The circuit as specified in claim 3, further comprising a sense amplifier for each bit line pair and electrically interposed between said true bit line and said complement bit line of each bit line pair, said sense amplifier for amplifying a differential potential between said selected and said non-selected bit lines for each bit line pair in order to amplify a logic state of the digital data of said accessed one of said memory storage cells.

5. The circuit as specified in claim 3, wherein a capacitance of said first and said second coupling means is selected such that the potential of said non-selected bit line is quickly changed from said initial bit line potential to provide a differential potential between said selected bit line and said non-selected bit line, said differential potential having a value facilitating an amplification of the digital data having a high logic state while also allowing a correct amplification of the digital data having a low logic state.

6. The circuit as specified in claim 3, further comprising bit line equilibrate circuitry for equilibrating said true and said complement bit lines to said initial bit line potential.

7. The circuit as specified in claim 6, further comprising a sense amplifier for each bit line pair and electrically interposed between said true bit line and said complement bit line of each bit line pair, said sense amplifier for amplifying a differential potential between said selected and said non-selected bit lines for each bit line pair in order to amplify a logic state of the digital data of said accessed one of said memory storage cells, wherein said initial bit line potential of said non-selected bit line is reduced prior to a transfer of the digital data having a high logic state to said selected bit line thereby rapidly driving said differential potential to said sense amplifier.

8. The circuit as specified in claim 6, further comprising a coupling line equilibrate circuit for equilibrating said true coupling line and said complement coupling line to an equilibrate potential substantially equal to said initial bit line potential prior to the selection of the selected coupling line by said coupling line selection means, said non-selected coupling line remaining at said equilibrate potential.

9. The circuit as specified in claim 3, wherein:
a) said first coupling means is a first capacitor having an active area of a substrate functioning as a storage node capacitor plate and having a polysilicon layer overlying said active area and functioning as a cell capacitor plate, said first capacitor having a dielectric layer interposed between said storage node capacitor plate and said cell capacitor plate; and
b) wherein said second coupling means is a second capacitor having an active area of a substrate functioning as a storage node capacitor plate and having a polysilicon layer overlying said active area and functioning as a cell capacitor plate, said second capacitor having a dielectric layer interposed between said storage node capacitor plate and said cell capacitor plate.

10. The circuit as specified in claim 9, wherein:
a) said true coupling line and said complement coupling line are comprised of a layer of polysilicon in electrical communication with said cell capacitor plate of said first capacitor and said second capacitor respectively; and
b) wherein said storage node capacitor plate of said first capacitor and said storage node capacitor plate of said second capacitor are in electrical communication with said true bit line and said complement bit line respectively.

11. The circuit as specified in claim 9, wherein said coupling potential is switched to said selected coupling line for a maximum time period established to avoid a breakdown of said dielectric of said first and said second coupling means.

12. The circuit as specified in claim 3, further comprising:
a) a first stray capacitance corresponding to said first coupling means and formed by said true coupling line and said complement bit line having an interposed dielectric layer; and
b) a second stray capacitance corresponding to said second coupling means and formed by said complement coupling line and said true bit line having an interposed dielectric layer.

13. The circuit as specified in claim 12, wherein a capacitance of said first coupling means is selected such that the ratio between said capacitance of said first coupling means and said first stray capacitance reduces the initial bit line potential prior to a high logic state of the digital data being electrically coupled to said selected bit line, and wherein a capacitance of said second coupling means is selected such that the ratio between said capacitance of said second coupling means and said second stray capacitance reduces the initial bit line potential prior to a high logic state of the digital data being electrically coupled to said selected bit line.

14. The circuit as specified in claim 3, further comprising:
   a) input/output lines for accepting data; and
   b) a column decoder means for selecting one of said bit line pairs and for transferring the digital data between the selected one of said bit line pairs and the input/output lines, wherein said selected bit line and said non-selected bit line exist for every one of said bit line pairs.

15. The circuit as specified in claim 3, wherein said coupling line driving means switches said selected coupling line to a reference potential.

16. A method for storing digital data in a memory storage cell comprising the following steps:
   a) equilibrating a bit line pair to a single fixed potential, hereinafter refereed to as a bit line equilibrate potential, during a precharge cycle, said bit line pair comprising a true bit line and a complement bit line;
   b) allowing said bit line pair to attain a potential other than said bit line equilibrate potential;
   c) selecting a selected bit line, said selected bit line being one of said true but line and said complement bit line, said selected bit line capable of electrical communication with a memory storage cell selected for accessing, a non-selected bit line being a remaining one of said true bit line and said complement bit line, said non-selected bit line isolated from said memory storage cell being accessed; and
   d) electrically coupling said non-selected bit line to a potential other than said bit line equilibrate potential to quickly provided a differential potential between said selected and said non-selected bit lines.

17. The method as specified in claim 16, further comprising electrically coupling said non-selected bit line to a potential lower than said bit line equilibrate potential thereby facilitating the amplification of the digital data having a high logic state for the memory storage cell being accessed while also allowing the correct amplification of the digital data having a low logic state.

18. The method as specified in claim 16, further comprising:
   a) coupling said digital data from the memory storage cell being accessed to said selected bit line, thereby rapidly attaining a valid differential potential for amplification;
   b) amplifying said differential potential between said selected bit line and said non-selected bit line; and
   c) latching the digital data to the true and complement bit lines.

19. The method as specified in claim 18, further comprising transferring said digital data between said true and complement bit lines and the input/output lines.

20. The method as specified in claim 17, further comprising:
   a) equilibrating a selected coupling line and a non-selected coupling line to a coupling line equilibrate potential;
   b) reducing said coupling line equilibrate potential of said selected coupling line from said coupling line equilibrate potential to a reference potential; and
   c) electrically coupling said non-selected bit line and said selected coupling line in order to accomplish said step of electrically coupling said non-selected bit line to said potential lower than said bit line equilibrate potential.

21. The circuit as specified in claim 1, wherein said coupling circuit comprises:
   a) a first coupling device electrically interposed between said non-selected bit line and said selected coupling line; and
   b) a second coupling device electrically interposed between said selected bit line and said non-selected coupling line.

22. A computer comprising:
   a) a memory storage cell for storing digital data;
   b) a selected bit line in electrical communication with said memory storage cell;
   c) a non-selected bit line, electrically isolated from said memory storage cell, having a first bit line potential;
   d) a selected coupling line capable of electrical communication with said non-selected bit line;
   e) a non-selected coupling line capable of electrical communication with said selected bit line;
   f) a coupling circuit electrically interposed between and capable of providing said electrical communication between said non-selected bit line and said selected coupling line and electrically interposed between and capable of providing said electrical communication between said selected bit line and said non-selected coupling line; and
   g) a coupling line selection circuit for driving a potential of said selected coupling line to a reference coupling potential,
      said reference coupling potential being substantially different than said first bit line potential, wherein said non-selected bit line is electrically coupled to said selected coupling line through said coupling circuit thereby effecting a second bit line potential on said non-selected bit line,
      said second bit line potential lying within a range of potentials between said first bit line potential and said reference coupling potential and including said reference coupling potential.

* * * * *